United States Patent [19]

Pritchard et al.

[11] Patent Number: 5,479,050
[45] Date of Patent: Dec. 26, 1995

[54] LEADFRAME WITH PEDESTAL

[75] Inventors: James W. Pritchard, Dallas; Dennis D. Davis, Garland, both of Tex.

[73] Assignee: Texas Instruments Incorporated, Dallas, Tex.

[21] Appl. No.: 321,373

[22] Filed: Oct. 11, 1994

Related U.S. Application Data

[63] Continuation of Ser. No. 600,370, Oct. 18, 1990, abandoned.
[51] Int. Cl.[6] .................................................. H01L 23/48
[52] U.S. Cl. ........................... 257/670; 257/673; 257/676
[58] Field of Search ...................... 357/65, 70; 257/633, 257/670, 673, 676

[56] References Cited

U.S. PATENT DOCUMENTS

| | | | |
|---|---|---|---|
| 4,486,945 | 12/1984 | Aigoo | 257/633 |
| 4,649,415 | 3/1987 | Hebert | 357/70 |
| 4,903,114 | 2/1990 | Aoki et al. | 357/70 |

*Primary Examiner*—Edward Wojciechowicz
*Attorney, Agent, or Firm*—Robby T. Holland; Wade James Brady, III; Richard L. Donaldson

[57] ABSTRACT

A raised pedestal is formed on a leadframe die mount pad and is used in forming an electrical connection between the die bond pad and the semiconductor die, the electrical connection being isolated from the shear forces developed during temperature cycling or during thermal shock of the resultant semiconductor device. Such shear forces usually result in destruction of the bond between the semiconductor die and the die bond pad.

4 Claims, 2 Drawing Sheets

LEADFRAME WITH PEDESTAL

This application is a continuation of application Ser. No. 07/7,370, filed Oct. 18, 1990, now abandoned.

FIELD OF THE INVENTION

This invention relates to leadframes for semiconductor devices, and more particularly to a leadframe with a raised pedestal to which a semiconductor die is attached with a ground wire.

BACKGROUND OF THE INVENTION

In plastic encapsulated DIP leadframes, the lead frame is designed to increase thermal dissipation with the semiconductor die mount extending across the majority of the width of the package. The width of the die pad is determined by the size of the semiconductor die, and the requirement of a die bond to the mount pad. Because of the larger die required for increased thermal dissipation, the ground bond is required to be in an area of highest shear stress. This causes fracturing of the ground bond during temperature cycling and thermal shock, and electrical failure of the device. Another problem is that the pad bond wire sags and makes contact with the die prior to molding.

Using a die pad bond with a smaller die has reduced the incident of failures, but has not totally eliminated the problem. In the case of larger die, the larger area on which to place the bond does not exist.

Another approach has been to provide holes in the die pad for locking the die pad to the mold compound, but this decreases the thermal capability that the leadframes was intended to provide, and has proven to be ineffective in locking the leadframe to the mold compound.

SUMMARY OF THE INVENTION

The invention is a semiconductor leadframe that has a pedestal stamped in the die pad mount to provide an area for the pad bond that is above the mount pad. The bond area is above the die surface, removed from the shear plane of the leadframe to mold compound, and is encased in mold compound. Destruction of the bond during temperature cycling and thermal shock is prevented. The bond wire being attached to a point above the surface of the die prevents sagging of the bond wire and unwanted contact of the wire with the die during bonding and prior to molding.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
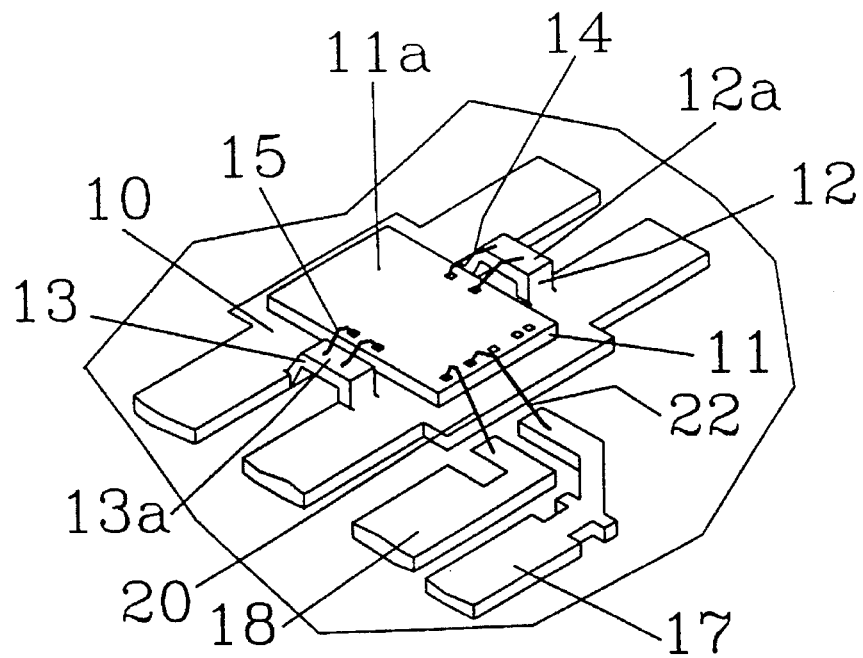
FIG. 1 is an isometric partial view of a leadframe of the present invention.

FIG. 1 is an isometric view of part of a semiconductor leadframe having a semiconductor die mounted thereon. Lead frame 10 has semiconductor die 11 mounted on die mount pad 16. On two sides of die 11 are raised pedestals that have been stamped out of a portion of the die mount pad. Bridges 12 and 13 are stamped from a part of die mount pad 16 and are of a height, for example, to place the top of the pedestal (12a and 13a) level with the top 11a of the die 11, or slightly higher. As an example, the pedestal may have a top from approximately 0.005 inch to 0.020 inch above the die mount pad. Typically, a pedestal top may be about 0.015 inch from the die pad surface. This dimension will vary with the size (and thickness) of the semiconductor die being mounted.

Since the stamping of the pedestal does not significantly remove any metal from the die mount pad, the thermal dissipation area remains approximately the same. Ground wires are bonded to the tops (12a and 13a) of the pedestals by wires 14 and 15. Connections to the die are made to ground pads on the die. Having the tops 12a and 13a of the pedestals at the height of or slightly higher than top 11a of die 11, wires 14 and 15 will not sag and contact the die at an undesirable location.

Die 11 is attached to the lead frame fingers 17 and 18 (only two are illustrated) in the usual manner, for example bonding wires 20 and 22 between the ends of the lead frame fingers and bond pads 19 and 21 on die 11.

Figure 2:
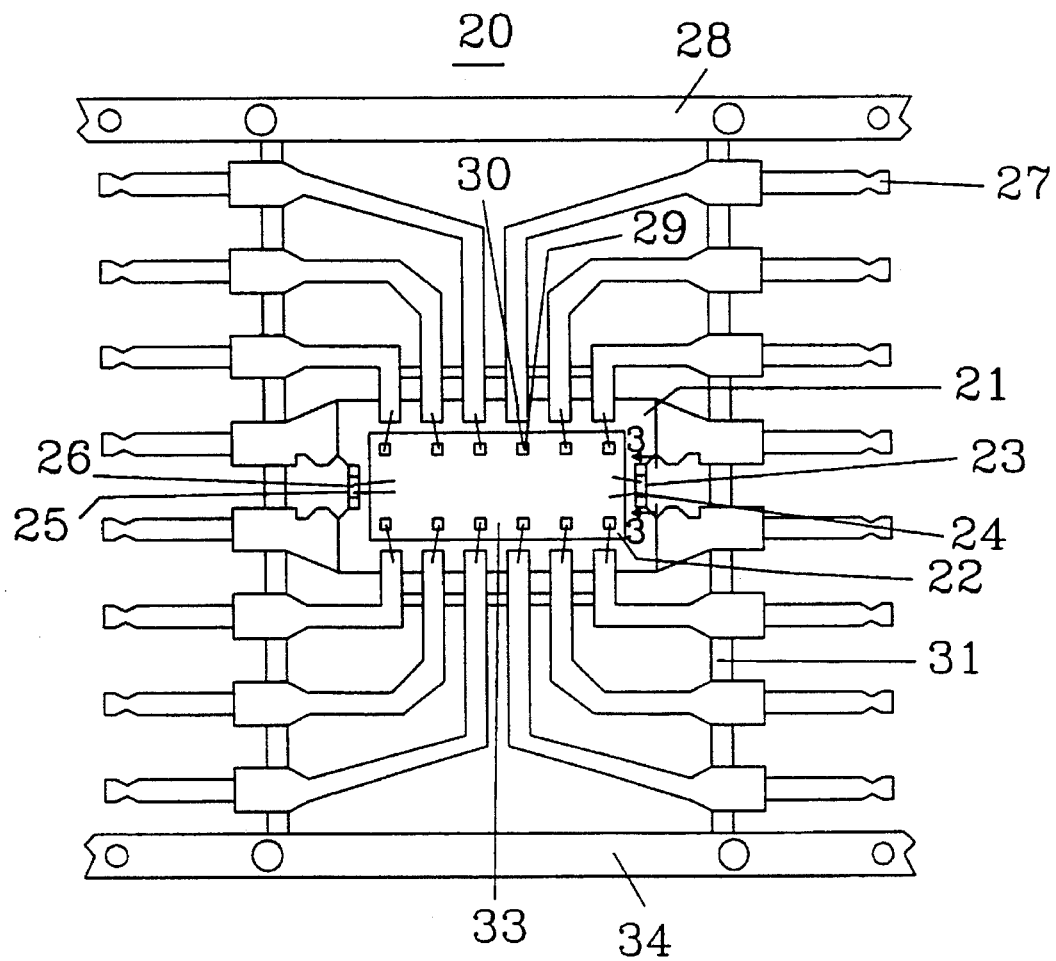
FIG. 2 is a top view of a leadframe illustrating the invention.

FIG. 2 is an example of a leadframe illustrating a possible location of two contact pedestals in relation to the leadframe and semiconductor die mounted thereon. Leadframe 20 has a die mount pad 21 and a semiconductor die 33 mounted thereon. At two ends of die 33 are raised pedestals 23 and 25 formed from the surface of die mount pad 21. Bridges, and therefore die mount pad 21, are electrically connected to die 33 by wires 24 and 26. Die 33 has a plurality of bond pads 22 thereon connected to leadframe fingers 17. Dam bars 31 connect the lead frame fingers together until the device is encapsulated in a mold compound. Also, the leadframe is connected to index strips 28 and 34 until all processing of the device is completed. Thereafter, the molded device is removed from the index strips and the dam bars are removed.

Figure 3:
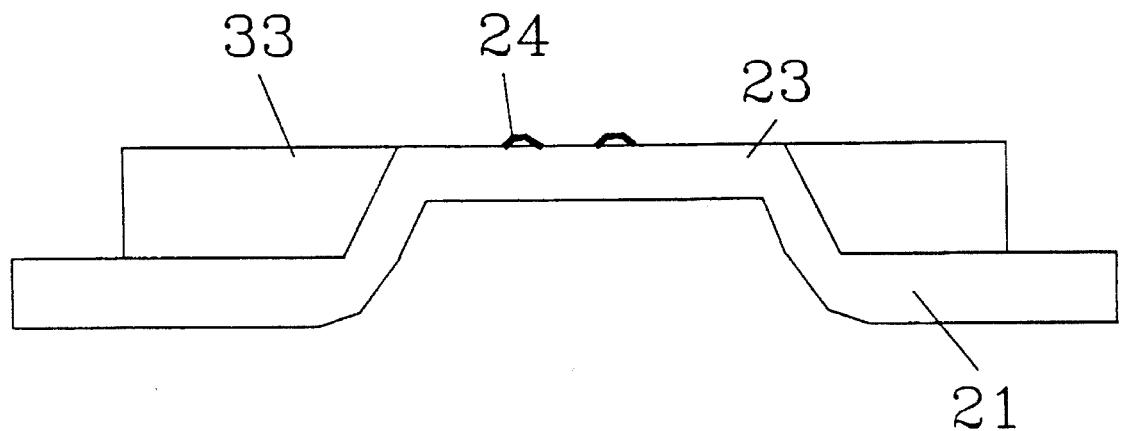
FIG. 3 is a view in section taken through section 3—3 of FIG. 2.

FIG. 3 is a side view of a raised pedestal showing the end of the semiconductor die and the electrically connections between the top of the pedestal and the die. FIG. 3 is a view taken along section line 3—3 of FIG. 2. Illustrated is pedestal 23 formed from die mount pad 21. Die 33 is connected to pedestal 23 by bond wires 24.

What is claimed:

1. The combination of a semiconductor die and a leadframe having a die mount pad thereon, comprising:

a semiconductor die mounted on a metal die mount pad forming part of the leadframe;

a self supporting contact area on die mount pad, formed from a part of the die mount pad raised above the semiconductor die; and a wire forming an electrical connection between the semiconductor die and said self supporting contact area on the die mount pad.

2. The combination according to claim 1, wherein the contact area is formed by stamping the contact area from the metal of the die mount pad.

3. The combination according to claim 2, wherein the contact area forms a pedestal with a contact area on the top thereon.

4. The combination according to claim 3 wherein the top of the pedestal is raised above one surface of the die mount pad from 0.005 inch to 0.2 inch.

* * * * *